United States Patent
Kim et al.

[11] Patent Number: 6,063,639
[45] Date of Patent: May 16, 2000

[54] METHOD FOR FABRICATING FERROELECTRIC CAPACITOR OF NONVOLATILE SEMICONDUCTOR MEMORY DEVICE USING PLASMA

[75] Inventors: Nam Kyeong Kim; Seung Jin Yeom, both of Ichon-shi, Rep. of Korea

[73] Assignee: Hyundai Electronics Industries Co., Ltd., Rep. of Korea

[21] Appl. No.: 09/429,128

[22] Filed: Oct. 28, 1999

[30] Foreign Application Priority Data

Oct. 28, 1998 [KR] Rep. of Korea .................. 98-45314

[51] Int. Cl.[7] .................................................. H01L 21/00
[52] U.S. Cl. ............................................. 438/3; 438/3
[58] Field of Search ..................... 438/3, 240, 256, 438/482, 393, 396, 399, 680, 681; 437/44

[56] References Cited

U.S. PATENT DOCUMENTS

| | | |
|---|---|---|
| 5,489,548 | 2/1996 | Nishioka et al. . |
| 5,504,041 | 4/1996 | Summerfelt . |
| 5,554,564 | 9/1996 | Nishioka et al. . |
| 5,554,866 | 9/1996 | Nishioka et al. . |
| 5,566,045 | 10/1996 | Summerfelt et al. . |
| 5,576,928 | 11/1996 | Summerfelt et al. . |
| 5,581,436 | 12/1996 | Summerfelt et al. . |
| 5,585,300 | 12/1996 | Summerfelt . |
| 5,589,284 | 12/1996 | Summerfelt et al. . |
| 5,619,393 | 4/1997 | Summerfelt et al. . |
| 5,626,906 | 5/1997 | Summerfelt et al. . |
| 5,665,628 | 9/1997 | Summerfelt . |
| 5,679,980 | 10/1997 | Summerfelt . |
| 5,696,018 | 12/1997 | Summerfelt . |
| 5,729,054 | 3/1998 | Summerfelt et al. . |
| 5,840,200 | 11/1998 | Nakagawa et al. . |
| 5,851,896 | 12/1998 | Summerfelt . |
| 5,994,153 | 11/1999 | Nagel et al. ................. 438/3 |

FOREIGN PATENT DOCUMENTS

| | | |
|---|---|---|
| 5-145123 | 6/1993 | Japan . |
| 5-313149 | 11/1993 | Japan . |
| 5-343616 | 12/1993 | Japan . |
| 6-260018 | 9/1994 | Japan . |
| 9-45662 | 2/1997 | Japan . |
| 10-200060 | 7/1998 | Japan . |

*Primary Examiner*—David Nelms
*Assistant Examiner*—David Nhu
*Attorney, Agent, or Firm*—Blakely Sokoloff Taylor & Zafman

[57] ABSTRACT

A method for fabricating a ferroelectric capacitor of nonvolatile semiconductor memory device includes the steps of forming an amorphous layer on a resulting structure after performing a specific process, forming perovskite nuclei within the amorphous layer by an oxidation reaction in plasma atmosphere and performing a thermal process for growing the grains to form a ferroelectric thin film. The perovskite nuclei are formed at a low temperature, so that the ferroelectric capacitor has improved properties such as high density, high polarization and low leakage current.

13 Claims, 2 Drawing Sheets

METHOD FOR FABRICATING FERROELECTRIC CAPACITOR OF NONVOLATILE SEMICONDUCTOR MEMORY DEVICE USING PLASMA

FIELD OF THE INVENTION

The present invention relates to a method for fabricating a nonvolatile semiconductor memory device having a ferroelectric capacitor; and, more particularly, to a method for forming perovskite nuclei of a ferroelectric thin film at a low temperature using plasma, thereby improving a density of the ferroelectric thin film.

DESCRIPTION OF THE PRIOR ART

As is well known to those skilled in the art, a ferroelectric thin film such as SBTO ($Sr_xBi_{2-y}Ta_2O_{9-z}$) and SBTNO ($Sr_xBi_{2-y}(Ta_iNb_j)_2O_{9-z}$) includes a Bi-layered perovskite structure. At this time, oxygen, vacancy and ions causing fatigue are consumed by bismuth-oxide ($Bi_{2-i}O_{3-j}$) layers in the Bi-layered perovskite structure, so that a property of fatigue can be improved. Therefore, the bismuth-oxide ($Bi_{2-i}O_{3-j}$) layers, which are formed as a layer structure within the ferroelectric thin film, serve as an important factor to improve the physical and electrical properties.

A method for fabricating a ferroelectric capacitor according to the prior art will be described below.

A lower electrode of a ferroelectric capacitor is formed and an SBTO or SBTNO layer is coated on the lower electrode. A baking process is then performed at a predetermined temperature capable of volatilizing organic materials, to thereby form an amorphous layer. Next, by applying a high thermal energy, perovskite-phase nuclei are formed on the SBTO or SBTNO layer. Finally, the grains are grown to a large size of 2000 Å to 3000 Å by a high-temperature thermal process, so that the device has good electrical properties.

At this time, if the high-temperature thermal process is performed without forming the perovskite nuclei, the grains are grown, if ever, to a size smaller than 700 Å. Since a thin film having such small grains also has a small polarization value, such a thin film is not suitable for the FeRAM (ferroelectric random access memory) device. Accordingly, in order to apply to the FeRAM device, which needs a ferroelectric property in the thin film, the grains should be formed to a large size. For this reason, the process for forming the nuclei is inevitably necessary.

In the prior art, the perovskite nuclei have been formed by a rapid thermal process (RTP), which is performed at a high temperature of more than 750° C. and a high speed of boosting voltage. However, in high density devices having a polysilicon plug, the grains are grown very fast at such a high temperature and a high speed of boosting voltage, so that a porous thin film may be formed in a following high-temperature thermal process.

SUMMARY OF THE INVENTION

It is, therefore, an object of the present invention to provide a method for forming a ferroelectric capacitor with a ferroelectric thin film having a high-density, high polarization and low leakage current by formation of perovskite nuclei at a low temperature using plasma, thereby improving an electrical property of nonvolatile semiconductor memory devices.

In accordance with an embodiment of the present invention, there is provided a method for fabricating a ferroelectric capacitor, comprising the steps of: a) forming an amorphous layer on a resulting structure after performing a specific process; b) forming perovskite nuclei causing an oxidation reaction in plasma environment; and c) performing a thermal process for growing the grains.

BRIEF DESCRIPTION OF THE DRAWINGS

This invention can be more fully understood from the following detailed description when taken in conjunction with the accompanying drawing, in which.

DETAILED DESCRIPTION OF THE PREFERRED EMBODIMENTS

When electrons accelerated in plasma atmosphere obtain sufficient energy, the electrons collide with gas species and reactions such as excitation and ionization occur. Therefore, highly reactive species such as excited neutrons or free radicals may be generated. At this time, in physical and chemical reactions, the reactive species generated in plasma atmosphere have a lower energy barrier and easily react at a lower temperature than their parent species.

Therefore, reactive gases such as $N_2O$, $O_2$ and $H_2O$, which are introduced into the plasma area to be activated and ionized, are diffused and penetrated into the SBTO or SBTNO layer including amorphous or organic materials. Metals (e.g., Sr, Bi, Ta, and Nb) are oxidized with the reactive gases to form the perovskite nuclei within the SBTO or SBTNO layer. By such a reaction as described above, the perovskite nuclei can be formed at a low temperature, so that the high-density ferroelectric thin film is obtained.

A method for fabricating a ferroelectric capacitor according to the present invention will be described below.

Figure 1:
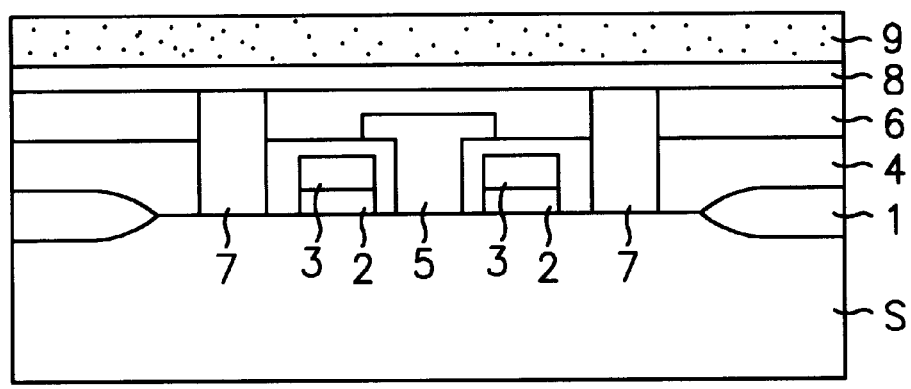
FIGS. 1 to 4 are cross-sectional views illustrating a ferroelectric capacitor of FeRAM in accordance with the present invention.

Referring to FIG. 1, a field oxide layer 1, a gate oxide layer 2, a gate electrode 3 and a first interlayer insulating layer 4 are sequentially formed. Next, a bit line 5, a second interlayer insulating layer 6 and a polysilicon plug 7 are formed. A glue layer 8 and a lower electrode 9 are sequentially formed on the resulting structure.

The lower electrode 9 is formed using metal layers (e.g., Pt layer, Ir layer or Ru layer) or conductive oxide materials (e.g., $IrO_{2-x}$ and $RuO_{2-y}$). In case where the lower electrode 9 is formed using the Pt layer, the glue layer 8 is formed using Ti layer, Ta layer, $Ta_2O_5$ layer, $Ta_xO_y$ layer or Ru layer. When the glue layer 8 is formed using Ti layer, $TiO_x$ is formed on the polysilicon plug 7 by an oxidization of the Ti layer. Additionally, when the glue layer 8 and the lower electrode 9 are formed with a stack structure of Ti/Pt layer, $TiO_{2-x}$ materials are formed on a boundary of a ferroelectric thin film performing a subsequent oxidation process. When the glue layer 8 is formed using Ta layer, $Ta_2O_5$ layer is formed on the Ta layer using a chemical vapor deposition (CVD) method.

Figure 2:
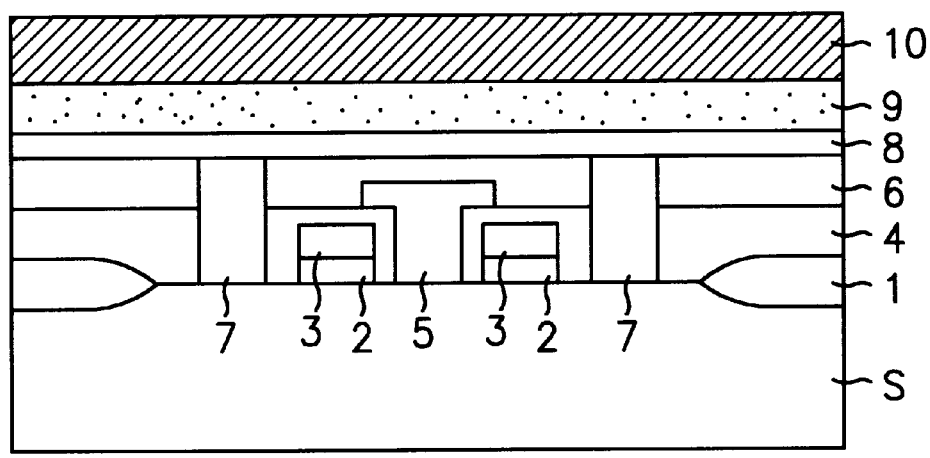

Next, referring to FIG. 2, an amorphous layer 10 of SBTO or SBTNO is coated on the lower electrode 9 using a spin-on coating method. In coating the amorphous layer 10 by the spin-on coating method, enhanced metal organic deposition (EMOD) chemicals are used, wherein the EMOD chemicals are organic compounds formed by a combination of Sr, Bi, Ta and Nb or by each material itself. At this time, n-butylacetate, octane and IPA (iso propyl acetate) are added in order to reduce a viscosity of the EMOD chemicals. The amorphous layer 10 can also be formed using PVD (physical vapor deposition), CVD (chemical vapor deposition), LSMCD (liquid source mist chemical deposition) or a laser ablation deposition.

Next, a baking process is performed at a temperature of 150° C. to 300° C. The baking process includes a first process for volatizing xylene and butyl acetate and a second process for volatizing 2-ethylexanoate and 2-ethylhexanoic acid.

Figure 3:
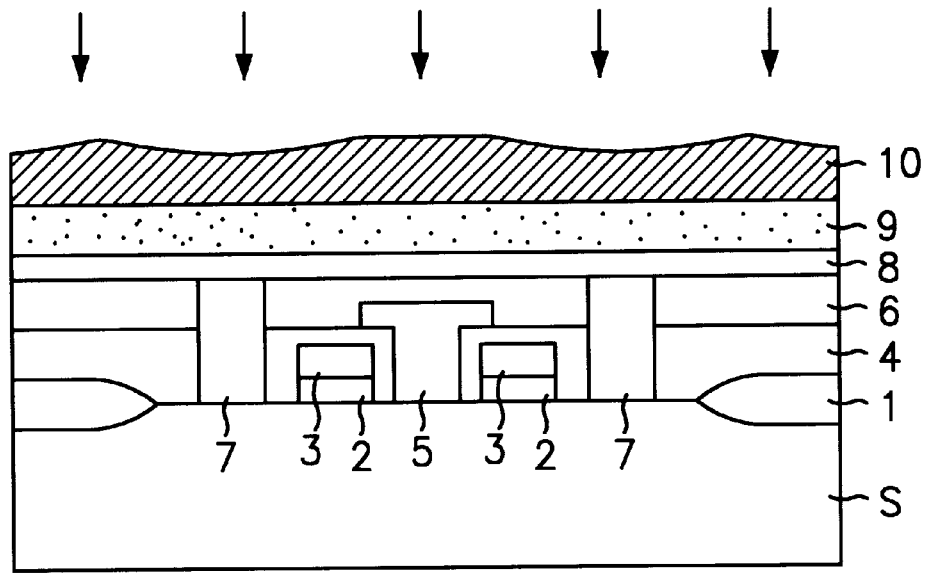

Sequentially, referring to FIG. 3, perovskite nuclei are formed on the amorphous layer 10 of SBTO or SBTNO to a thickness of 800 Å to 3000 Å by an oxidation reaction in plasma atmosphere. At this time, one or a plurality selected from the group consisting of $N_2O$, $O_2$, $H_2O$, $N_2O(gas)+H_2O$ (liquid) and $O_2(gas)+HO_2(liquid)$ are introduced into a chamber which maintains plasma atmosphere, so that the perovskite nuclei are formed within the amorphous layer 10 by a rapid oxidation reaction. In case of a diffusion of $N_2O(gas)+H_2O(liquid)$, $O_2(gas)+H_2O(liquid)$, $N_2O(gas)$ and $O_2(gas)$ are wetted through a bubbler containing $H_2O$ (liquid) and thus become a vapor state to absorb many reactive gases. In forming the perovskite nuclei, the plasma atmosphere is maintained at a plasma power of 80 W to 800 W using RF, ECR (electron cyclotron resonance) and so on, at pressure of 0.5 Torr to 5 Torr and at a substrate temperature of 350° C. to 550° C.

Figure 4:
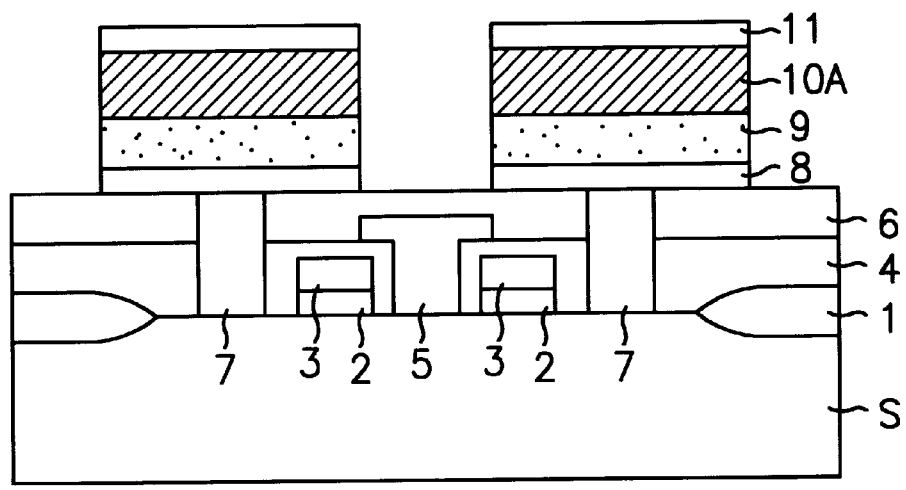

Next, referring to FIG. 4, a thermal process for growing the grains is performed to form a ferroelectric thin film 10A and an upper electrode 11 is formed on the ferroelectric thin film 10A.

Finally, a ferroelectric capacitor is formed by patterning the upper electrode 11, the ferroelectric thin film 10A, the lower electrode 9 and the glue layer 8. In subsequent process, an interlayer insulating layer, e.g., $SiO_2$ layer is formed.

As described above, it is possible for the perovskite nuclei to form into the SBTO or SBTNO layer at a low processing temperature using plasma, so that the high-density ferroelectric thin film is obtained. Therefore, the polarization is high and a leakage current is low, thereby improving the electric properties of the nonvolatile semiconductor memory device.

While the present invention has been described with respect to certain preferred embodiments only, other modifications and variation may be made without departing from the spirit and scope of the present invention as set forth in the following claims.

What is claimed is:

1. A method for fabricating a ferroelectric capacitor, comprising the steps of:
   a) forming an amorphous layer on a resulting structure after performing a specific process;
   b) forming perovskite nuclei within the amorphous layer by an oxidation reaction in plasma atmosphere; and
   c) performing a thermal process for growing the grains to form a ferroelectric thin film.

2. The method as recited in claim 1, wherein the step b) further includes the step of diffusing one or a combination selected from the groups consisting of $N_2O(gas)$, $O_2(gas)$, $H_2O(gas)$, $N_2O(gas)+H_2O(liquid)$ and $O_2(gas)H_2O(liquid)$ into a chamber which maintains plasma atmosphere.

3. The method as recited in claim 2, wherein the plasma atmosphere in the step b) is maintained at a plasma power of 80 W to 800 W using RF (radio frequency) method or ECR (electron cyclotron resonance) method.

4. The method as recited in claim 3, wherein the plasma atmosphere is maintained at a pressure of 0.5 Torr to 5 Torr.

5. The method as recited in claim 4, wherein the plasma atmosphere is maintained at a temperature of 350° C. to 550° C.

6. The method as recited in claim 2, wherein the amorphous layer includes one or a combination selected from the groups consisting of strontium (Sr), bismuth (Bi), tantalum (Ta) and niobium (Nb).

7. The method as recited in claim 6, wherein the step b) further includes the step of baking the amorphous layer.

8. The method as recited in claim 7, wherein the baking process includes a first process for volatilizing xylene and butyl acetate and a second process for volatilizing 2-ethylhexanoate and 2-ethylhexanoic acid.

9. The method as recited in claim 8, wherein the baking process is performed at a temperature of 150° C. to 300° C.

10. The method as recited in claim 9, wherein the amorphous layer in step a) is formed to a thickness of 800 Å to 3000 Å.

11. The method as recited in claim 10, wherein the plasma atmosphere in the step b) is maintained at a plasma power of 80 W to 200 W using RF (radio frequency) method or ECR (electron cyclotron resonance) method.

12. The method as recited in claim 11, wherein the plasma atmosphere is maintained at a pressure of 0.5 Torr to 5 Torr.

13. The method as recited in claim 12, wherein the plasma atmosphere is maintained at a temperature of 350° C. to 550° C.

* * * * *